(12) United States Patent
Liu et al.

(10) Patent No.: US 12,094,770 B2
(45) Date of Patent: Sep. 17, 2024

(54) RUTHENIUM-BASED LINER FOR A COPPER INTERCONNECT

(71) Applicant: Taiwan Semiconductor Manufacturing Company, Ltd., Hsinchu (TW)

(72) Inventors: Yao-Min Liu, Taipei (TW); Ming-Yuan Gao, Hsinchu (TW); Ming-Chou Chiang, Taichung (TW); Shu-Cheng Chin, Hsinchu (TW); Huei-Wen Hsieh, Hsinchu (TW); Kai-Shiang Kuo, Hsinchu (TW); Yen-Chun Lin, Hsinchu (TW); Cheng-Hui Weng, Hsinchu (TW); Chun-Chieh Lin, Taichung (TW); Hung-Wen Su, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 408 days.

(21) Appl. No.: 17/446,398

(22) Filed: Aug. 30, 2021

(65) Prior Publication Data
US 2023/0068398 A1 Mar. 2, 2023

(51) Int. Cl.
*H01L 21/768* (2006.01)
*H01L 21/304* (2006.01)
*H01L 23/522* (2006.01)
*H01L 23/532* (2006.01)

(52) U.S. Cl.
CPC ...... *H01L 21/76841* (2013.01); *H01L 21/304* (2013.01); *H01L 21/76802* (2013.01); *H01L 21/76877* (2013.01); *H01L 23/5226* (2013.01); *H01L 23/53238* (2013.01)

(58) Field of Classification Search
CPC ............. H01L 21/76841; H01L 21/304; H01L 21/76802; H01L 21/76877; H01L 23/5226; H01L 23/53238; H01L 21/76843; H01L 21/76846; H01L 21/76849; H01L 21/76897
See application file for complete search history.

(56) References Cited

U.S. PATENT DOCUMENTS

| | | | |
|---|---|---|---|
| 10,262,943 B2 * | 4/2019 | Kolics | H01L 21/76829 |
| 11,393,753 B2 * | 7/2022 | Lee | H01L 21/76846 |
| 11,694,926 B2 * | 7/2023 | Hsueh | H01L 21/76895 |
| | | | 257/774 |
| 2005/0153544 A1 * | 7/2005 | Suh | H01L 21/76844 |
| | | | 438/643 |
| 2008/0083989 A1 * | 4/2008 | Aoi | H01L 21/28562 |
| | | | 257/E21.171 |
| 2016/0163586 A1 * | 6/2016 | Siew | H01L 23/5226 |
| | | | 438/653 |
| 2016/0276280 A1 * | 9/2016 | Edelstein | C23C 16/505 |
| 2017/0278794 A1 * | 9/2017 | Edelstein | H01L 23/53266 |
| 2018/0096888 A1 * | 4/2018 | Naik | H01L 21/76849 |

(Continued)

*Primary Examiner* — Bac H Au
(74) *Attorney, Agent, or Firm* — Harrity & Harrity, LLP

(57) ABSTRACT

In some implementations, one or more semiconductor processing tools may form a via within a substrate of a semiconductor device. The one or more semiconductor processing tools may deposit a ruthenium-based liner within the via. The one or more semiconductor processing tools may deposit, after depositing the ruthenium-based liner, a copper plug within the via.

20 Claims, 10 Drawing Sheets

(56) References Cited

U.S. PATENT DOCUMENTS

| | | | |
|---|---|---|---|
| 2018/0261544 A1* | 9/2018 | Kim | H01L 23/53223 |
| 2019/0189508 A1* | 6/2019 | Peethala | H01L 21/76856 |
| 2019/0244896 A1* | 8/2019 | Lee | H01L 23/5226 |
| 2019/0304918 A1* | 10/2019 | Griggio | H01L 21/76858 |
| 2020/0135557 A1* | 4/2020 | Huang | H01L 21/76805 |
| 2021/0159117 A1* | 5/2021 | Wang | H01L 21/7684 |
| 2021/0242082 A1* | 8/2021 | Maniscalco | H01L 21/76846 |
| 2021/0287994 A1* | 9/2021 | Hsueh | H01L 21/76832 |
| 2021/0335659 A1* | 10/2021 | Motoyama | H01L 21/76841 |
| 2022/0246534 A1* | 8/2022 | Chin | H01L 21/76867 |
| 2022/0246535 A1* | 8/2022 | Chin | H01L 23/5226 |

\* cited by examiner

RUTHENIUM-BASED LINER FOR A COPPER INTERCONNECT

BACKGROUND

A semiconductor device, such as an integrated circuit, may include interconnects made of copper to reduce propagation delays and power consumption, when compared with other metal interconnects, when the semiconductor device is in operation. Additionally, a semiconductor device that uses copper interconnects may have interconnects with narrower dimensions than a semiconductor device that uses another metal (e.g., aluminum) for interconnects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
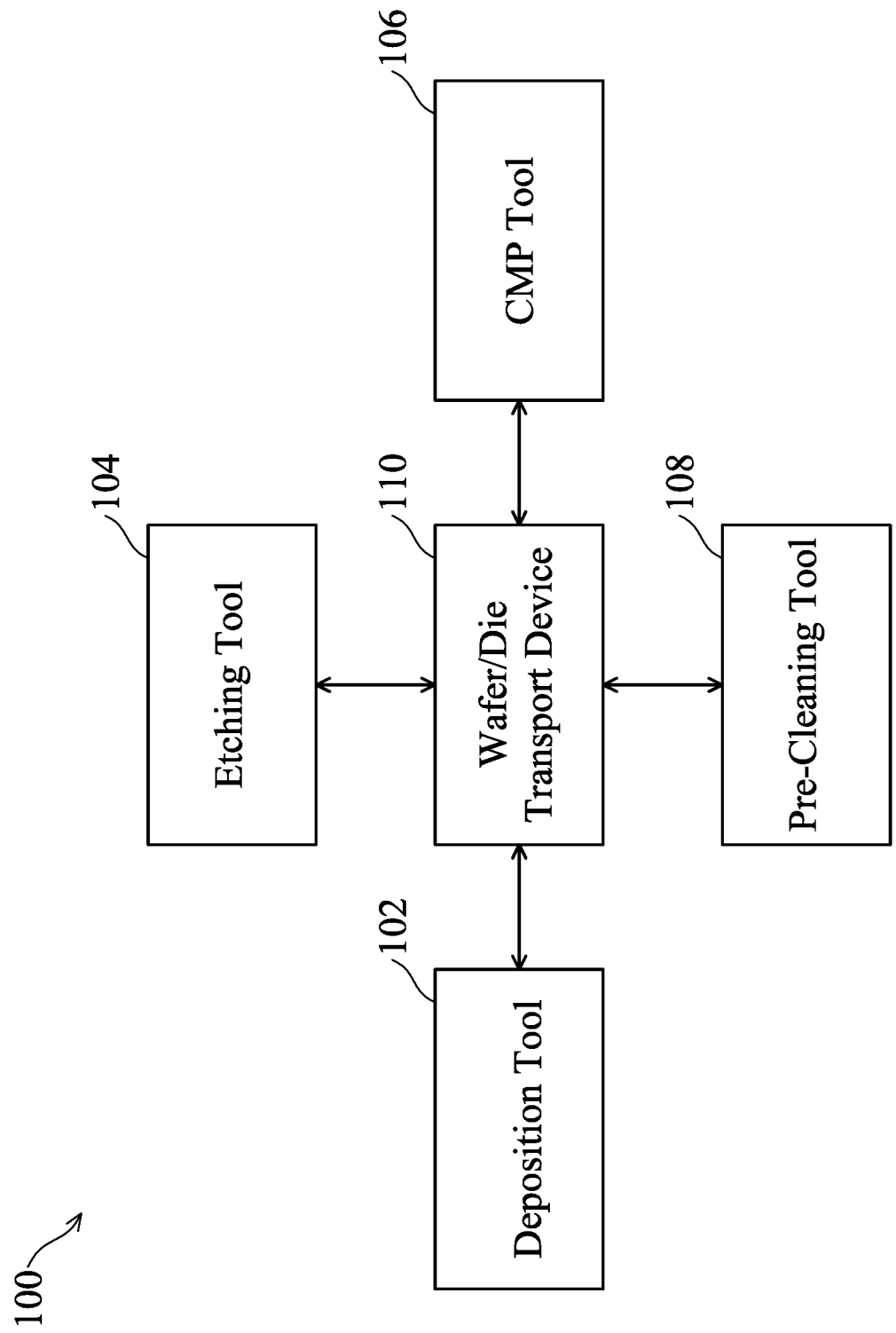
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device with copper interconnects may have improved performance when compared with a semiconductor device that includes interconnects made from other metals, such as aluminum. For example, a semiconductor device with copper interconnects may have reduced power consumption and/or reduced propagation delay, during operation, based on characteristics of the copper material. Additionally, because of the characteristics of the copper material, the copper interconnects may be narrower than interconnects made from other metals. However, during manufacturing processes, filling a via with the copper material may be challenging.

In some manufacturing processes, when attempting to fill a via having narrow dimensions (e.g., less than about 12 nanometers), the copper material may not penetrate into the via and may leave other materials (e.g., a gas) within a volume of the via. For example, some manufacturing processes may include depositing a cobalt liner within the via before attempting to fill the via with the copper material. The cobalt liner may result in a cobalt protrusion and a copper protrusion from a top portion of the via toward a center of the via, resulting in a pinch point at the top portion of the via. When attempting to fill the via with the copper material, the pinch point may inhibit flow of copper material into the via during a copper reflow process and/or may prevent the copper from fully filling a lower portion of the via. This may result in air voids within the via (e.g., portions without copper), which may reduce performance of the copper interconnect within the semiconductor device.

Some implementations described herein provide techniques and apparatuses for forming a semiconductor device with a ruthenium-based liner for a copper interconnect. In some implementations, the semiconductor device may include a barrier layer, such as a tantalum nitride-based barrier, deposited within a via. The semiconductor device may include a ruthenium-based liner on the barrier layer and, optionally, a cobalt liner deposited on the ruthenium-based liner. If using the optional cobalt liner in addition to the ruthenium-based liner, material of the cobalt liner and material of the ruthenium-based liner may mix to form a ruthenium-based liner that includes ruthenium material and cobalt material. The semiconductor device may include a copper plug disposed within the via on the ruthenium-based liner (e.g., a ruthenium-based liner that does not include cobalt material or a ruthenium-based liner that includes cobalt material). The semiconductor device may include one or more caps on the copper plug. For example, the one or more caps may include a ruthenium cap (e.g., if a cobalt liner is not included in the via) and/or a cobalt cap.

Based on using a ruthenium-based liner within the via, copper material may fill (e.g., completely fill or generally fill) the via, even when the via is narrow (e.g., less than about 12 nanometers). In some implementations, the ruthenium-based liner may reduce a protrusion into a top portion of the via and/or may reduce a pinch point at the top portion of the via. This may facilitate deposition of the copper plug within the via, which may improve uniformity of copper material within the via, reduce voids within the via, and improve performance of the copper plug as a copper interconnect within the semiconductor device.

FIG. 1 is a diagram of an example environment 100 in which systems and/or methods described herein may be implemented. As shown in FIG. 1, environment 100 may include a plurality of semiconductor processing tools 102-108 and a wafer/die transport device 110. The plurality of semiconductor processing tools 102-108 may include a deposition tool 102, an etching tool 104, a chemical-mechanical polishing (CMP) tool 106, and/or a pre-cleaning tool 108, among other examples. The semiconductor processing tools included in example environment 100 may be included in a semiconductor clean room, a semiconductor foundry, and/or a semiconductor processing and/or manufacturing facility, among other examples.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching (e.g., removing) various types of materials of a substrate, wafer, or semiconductor device. For example, etching tool 104 may include a wet etching tool, a dry etching tool, a laser etching tool, a chemical etching tool, a plasma etching tool, a reactive ion etching tool, a sputter etching tool, and/or a vapor phase etching tool, among other examples. A wet etching tool may include a chamber that is filled with an etchant, and the substrate may be placed in the chamber for a particular time period to remove particular amounts of one or more portions of the substrate. A dry etching tool may remove one or more portions of the substrate using a plasma etch technique (e.g., a plasma sputtering technique) and/or a plasma-assisted etch, which may involve using an ionized gas to isotopically or directionally etch the one or more portions. In some implementations, etching tool 104 may remove a layer from a semiconductor device as described herein.

CMP tool 106 is a semiconductor processing tool that includes one or more devices capable of polishing or planarizing various layers of a wafer or semiconductor device. In some implementations, CMP tool 106 may polish or planarize a layer of deposited or plated material. The CMP tool 106 may polish or planarize a surface of a semiconductor device with a combination of chemical and mechanical forces (e.g., chemical etching and free abrasive polishing). The CMP tool may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Pre-clean tool 108 is a semiconductor processing tool that includes a pre-cleaning chamber and/or one or more devices capable of performing a pre-cleaning process on a semiconductor device to remove material (e.g., residue from a CMP operation and/or an oxide layer, among other examples) from the semiconductor device. The one or more devices may include a gas source, a plasma source, a heat source, and/or the like. The gas source may supply various gasses to pre-clean chamber, such as a hydrogen gas and/or ammonia plasma, among other examples. The plasma source may generate a plasma that causes a reaction between gasses supplied to the pre-clean chamber. For example, the plasma source may include an inductively coupled plasma source, a transformer coupled plasma source, or another type of plasma source capable of causing a reaction between an ammonia gas and a nitrogen trifluoride gas to cause the formation of an ammonium fluoride gas. The heat source may be capable of heating a semiconductor device in the pre-clean chamber to cause one or more layers on the semiconductor device to decompose, as described herein. For example, the heat source may include a heat lamp, a heating coil, or another type of heating device that heats the semiconductor device to cause a protection layer on the semiconductor device to decompose into an ammonia gas and a hydrogen fluoride gas. Pre-clean tool 108 may be integrated with Deposition tool 102 to prevent, or reduce a likelihood of, a vacuum break.

Wafer/die transport device 110 includes a mobile robot, a robot arm, a tram or rail car, and/or another type of device that is used to transport wafers and/or dies between semiconductor processing tools 102-108 and/or to and from other locations such as a wafer rack, or a storage room, among other examples. In some implementations, wafer/die transport device 110 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2H are diagrams of one or more example implementations described herein. Example implementation(s) may include one or more example implementations of a process for manufacturing a semiconductor device 200, as described herein. As described below, example implementation(s) may include a process of manufacturing the semiconductor device 200 with a ruthenium-based liner and a copper plug within a via of the device 200.

Figure 2A:
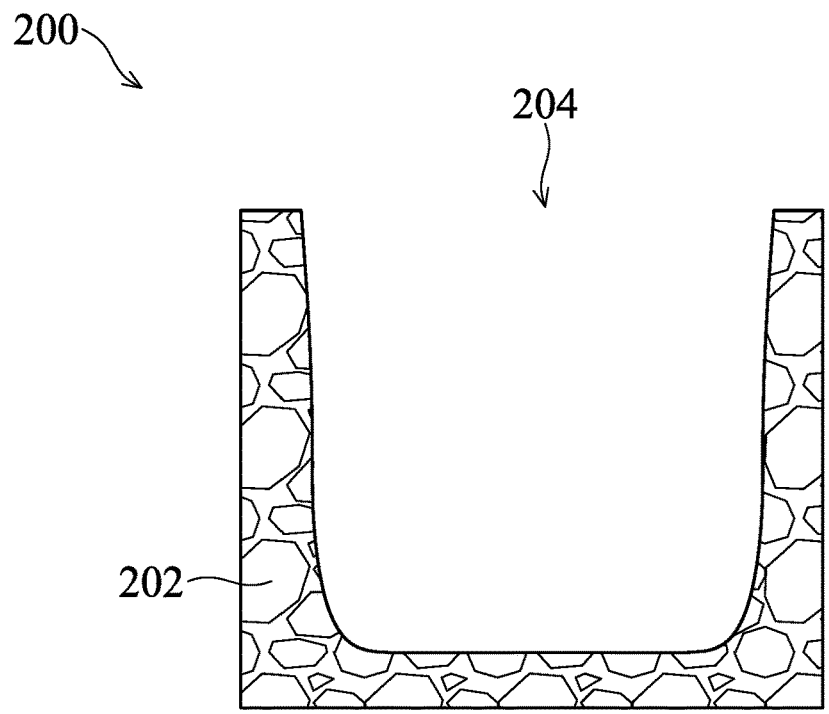
FIGS. 2A-2H are diagrams illustrating a sequence of operations for manufacturing a semiconductor device, as described herein.

As shown in FIG. 2A, the semiconductor device 200 may include a substrate 202 and a via 204. In some implementations, the substrate may include a silicon-based material. In some implementations, one or more semiconductor processing tools may form the via 204 within the substrate 202. For example, an etching tool (e.g., etching tool 104) may etch a portion of the substrate 202 to form the via 204 (e.g., a recessed portion of the substrate 202).

Figure 2B:
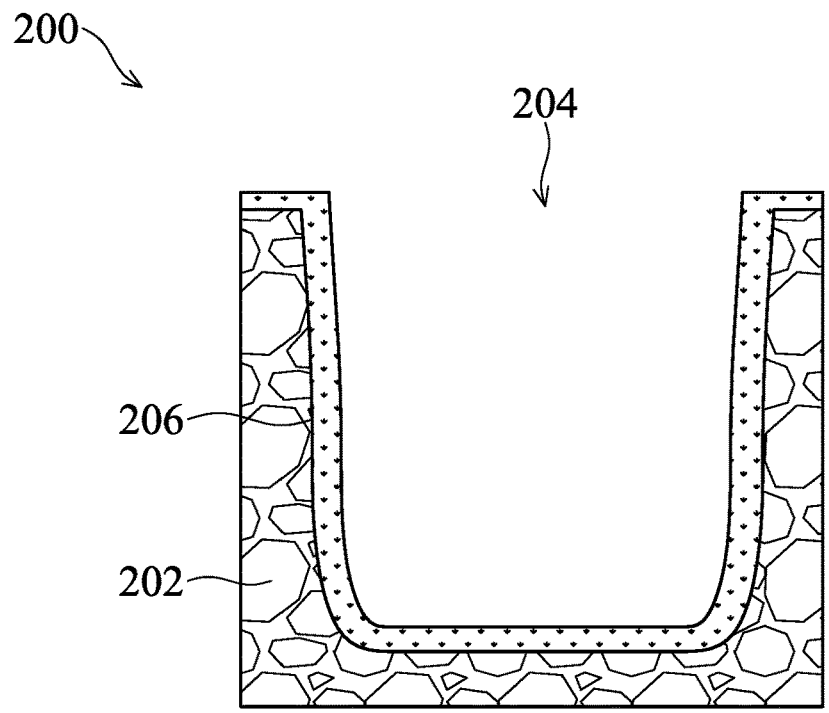

As shown by FIG. 2B, one or more semiconductor processing tools may deposit a tantalum nitride-based liner 206 (e.g., a barrier layer) on the substrate 202 within the via 204 and/or outside of the via 204 of the semiconductor device 200 (e.g., on an upper surface of the semiconductor device 200). In some implementations, a deposition tool (e.g., deposition tool 102) may deposit the tantalum nitride-based liner 206 onto the substrate 202 of the semiconductor device 200. In some implementations, the deposition tool may use high density plasma deposition, plasma-enhanced chemical vapor deposition, chemical vapor deposition, or physical vapor deposition, among other examples, to deposit the tantalum nitride-based liner 206 onto the substrate 202 of the semiconductor device 200. In some aspects, the tantalum nitride-based liner 206 may form a barrier between the substrate 202 and the via 204. The tantalum nitride-based liner 206 may prevent and/or reduce diffusion of materials from within the via (e.g., copper material) into the substrate 202, which may damage the semiconductor device 200.

Figure 2C:
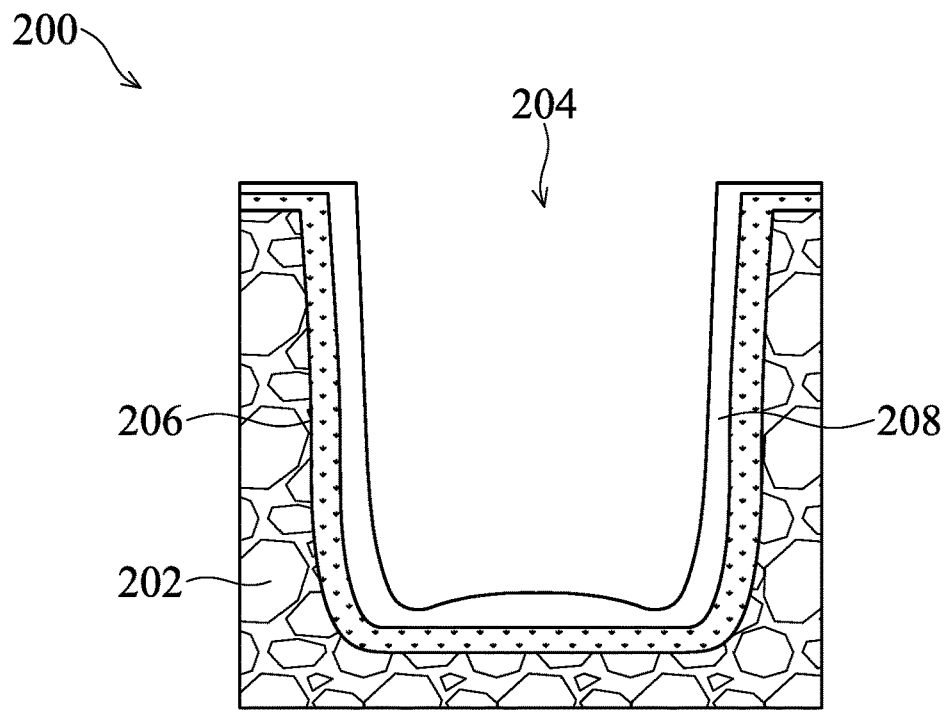

As shown by FIG. 2C, one or more semiconductor processing tools may deposit a ruthenium-based liner 208 (e.g., a barrier layer) within the via 204 and/or outside of the via 204 of the semiconductor device 200 (e.g., on the upper surface of the semiconductor device 200). In some implementations, the ruthenium-based liner 208 may be disposed on the tantalum nitride-based liner 206. In some implementations, a deposition tool (e.g., deposition tool 102) may deposit the ruthenium-based liner 208 within the via 204 (e.g., on the tantalum nitride-based liner 206) of the semiconductor device 200. In some implementations, the deposition tool may use high density plasma deposition, plasma-enhanced chemical vapor deposition, chemical vapor deposition, or physical vapor deposition, among other examples, to deposit the ruthenium-based liner 208 within the via 204 (e.g., on the tantalum nitride-based liner 206). In some implementations, the ruthenium-based liner 208 may have a thickness in a range from approximately 0.5 to 3 nanometers (e.g., 0.5 to 2 nanometers).

Figure 2D:
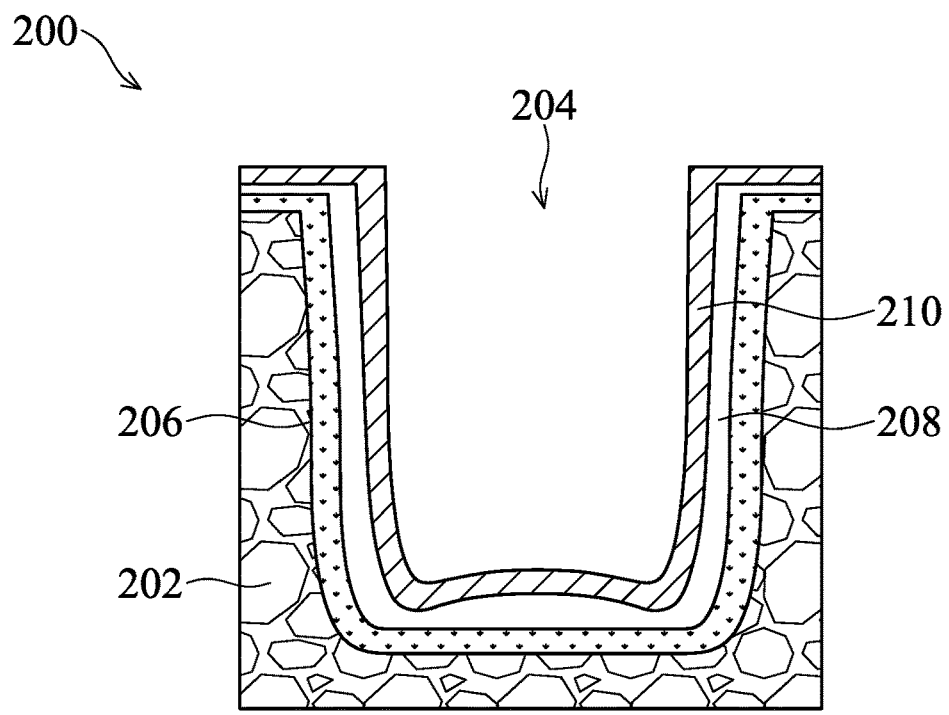

As shown by FIG. 2D, one or more semiconductor processing tools may deposit a cobalt-based liner 210 (e.g., a barrier layer) within the via 204 and/or outside of the via 204 of the semiconductor device 200 (e.g., on the upper surface of the semiconductor device 200). In some implementations, the cobalt-based liner 210 may be disposed on the ruthenium-based liner 208 or on another barrier layer of the semiconductor device 200. In some implementations, a deposition tool (e.g., deposition tool 102) may deposit the cobalt-based liner 210 within the via 204 (e.g., on the ruthenium-based liner 208) of the semiconductor device 200. In some implementations, the deposition tool may use high density plasma deposition, plasma-enhanced chemical vapor deposition, chemical vapor deposition, or physical vapor deposition, among other examples, to deposit the cobalt-based liner 210 within the via 204 (e.g., on the ruthenium-based liner 208).

In some implementations, the ruthenium-based liner 208 and the cobalt-based liner 210 may intermix to form a combined ruthenium-based liner that includes ruthenium material and cobalt material. For example, ruthenium material of the ruthenium-based liner 208 may diffuse into the cobalt-based liner 210 to form a partially mixed or fully mixed ruthenium-cobalt-based liner (e.g., shown in FIGS. 3E and 3F). The ruthenium material may diffuse into the cobalt-based liner based on a reaction (e.g., a chemical reaction) between the ruthenium material and cobalt material that is triggered upon deposition of the cobalt-based liner 210 on the ruthenium-based liner 208. In some implementations, the cobalt-based liner 210 may be ruthenium-doped based on diffusion of the ruthenium material into the cobalt-based liner 210. The combined ruthenium-based liner may include some ruthenium material on an inner surface of the cobalt-based liner 210 (e.g., a surface exposed in the via 204 that will contact a copper plug 214 shown in FIG. 2F) and/or some cobalt material on the inner surface of the ruthenium-based liner 208 (e.g., a surface opposite the tantalum nitride-based layer 206). Based on ruthenium material being on the inner surface of the cobalt-based liner 210, the ruthenium material may reduce a pinch point at a top portion of the via 204 and may improve deposition of a metal material (e.g., a copper material) within the via 204.

In some implementations, the ruthenium material and the cobalt material may partially mix. For example, atoms of the ruthenium material may react (e.g., bond) with atoms of the cobalt material. In some implementations, based on the ruthenium material and the cobalt material partially or fully intermixing, the cobalt-based liner 210 may have a more-uniform thickness (e.g., based on a reduced surface tension at a top portion of the via 204) and may reduce a pinch point at the top portion of the via 204.

The cobalt-based liner 210 may be an optional layer of the semiconductor device 200. The semiconductor device 200 may include the cobalt-based liner 210 between the ruthenium-based liner 208 and another material within the via 204 (e.g., copper material 212 shown at FIG. 2E). In implementations that include the cobalt-based liner 210, the cobalt-based liner 210 may have a thickness in a range of approximately 0.5 to 3 nanometers (e.g., as deposited and before mixing with the ruthenium-based liner 208). A combined ruthenium layer (e.g., including the ruthenium-based liner 208 and the cobalt-based liner 210) may have a thickness in a range of approximately 1 to 5 nanometers. In some implementations, the semiconductor device 200 may not include the cobalt-based liner 210, and the ruthenium-based liner 208 may be in contact with another material within the via 204 (e.g., the copper material 212 shown at FIG. 2E).

Figure 2E:
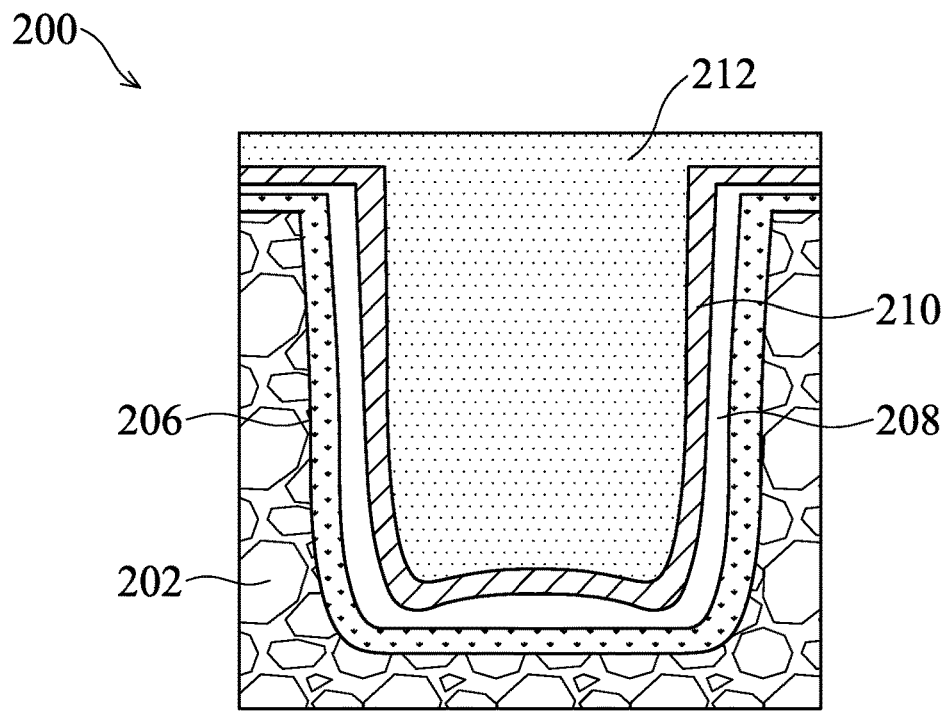

As shown by FIG. 2E, one or more semiconductor processing tools may deposit a copper material 212 within the via 204 and/or outside of the via 204 of the semiconductor device 200 (e.g., on the upper surface of the semiconductor device 200). In some implementations, the copper material may be disposed on the ruthenium-based liner 208, on the cobalt-based liner 210, or on the combined ruthenium-based liner. In some implementations, a deposition tool (e.g., deposition tool 102) may deposit the copper material 212 within the via 204 (e.g., on the ruthenium-based liner 208, on the cobalt-based liner 210, or on the combined ruthenium-based liner) of the semiconductor device 200. In some implementations, the deposition tool may use high density plasma deposition, plasma-enhanced chemical vapor deposition, chemical vapor deposition, or physical vapor deposition, among other examples, to deposit the copper material 212 within the via 204 (e.g., on the ruthenium-based liner 208, on the cobalt-based liner 210, or on the combined ruthenium-based liner). In some implementations, the deposition tool may deposit the copper material 212 and then perform a reflow deposition operation, such as plating the copper material 212 and/or heating the copper material to cause the copper material 212 to flow into the via 204.

Figure 2F:
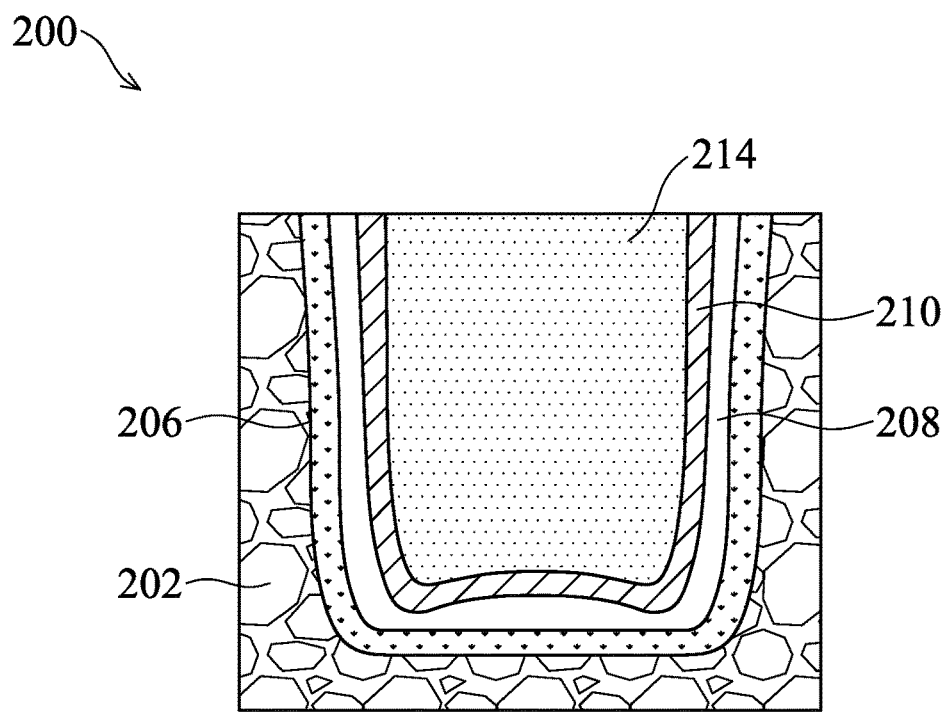
Figure 2G:
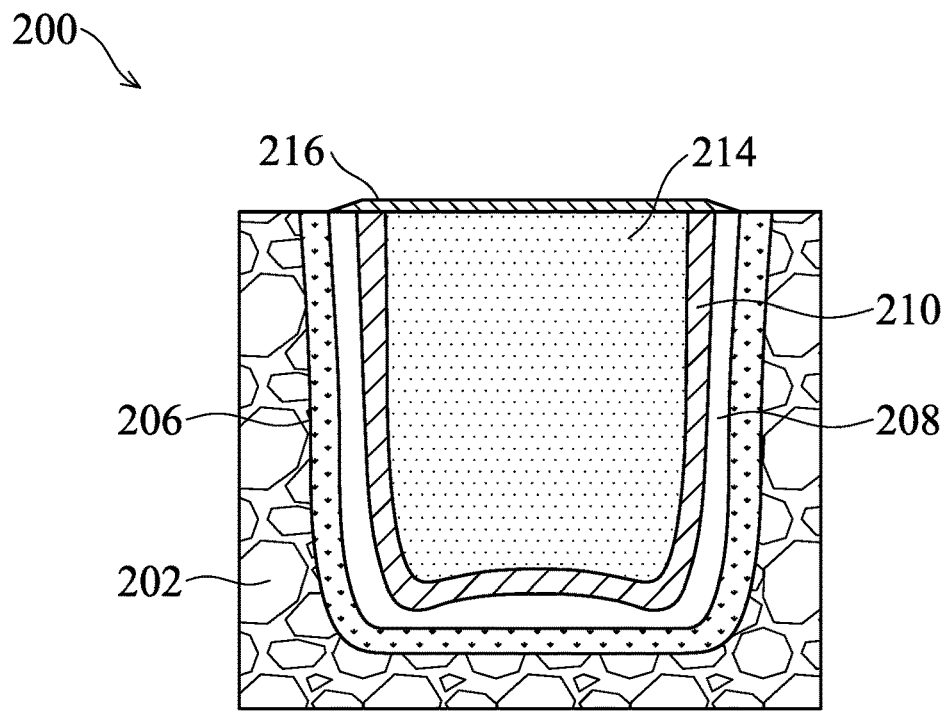

As shown by FIG. 2F, one or more semiconductor processing tools may remove an upper portion of the semiconductor device 200. In some implementations, a CMP tool (e.g., CMP tool 106) may planarize the upper surface of the semiconductor device 200 and remove the upper portion of the semiconductor device 200. In some implementations, the CMP tool may remove one or more materials, such as the tantalum nitride-based liner 206, the ruthenium-based liner 208, the cobalt-based liner 210, and/or the copper material 212 from the semiconductor device 200 in a region outside of the via 204 (e.g., from the upper surface of the semiconductor device 200).

In some implementations, the CMP tool may form a copper interconnect within the via 204 that comprises a copper plug 214 (e.g., from the copper material 212 within the via 204), the cobalt-based liner 210, the ruthenium-based liner 208, and/or the tantalum nitride-based liner 206, among other example materials.

As shown by reference number 2G, one or more semiconductor processing tools may deposit a ruthenium cap 216 on an upper portion of the semiconductor device 200 (e.g., an upper surface of copper plug 214, an upper surface of the cobalt-based liner 210, an upper surface of the ruthenium-based liner, an upper surface of the combined ruthenium-based liner, and/or an upper surface of the tantalum nitride-based liner, among other example materials). In some implementations, deposition of the ruthenium cap 216 may include multiple operations by one or more semiconductor processing tools.

For example, a pre-cleaning tool (e.g., pre-cleaning tool 108) may remove residue (e.g., remaining from an operation of the CMP tool) from the upper surface of the semiconductor device 200 before depositing the ruthenium cap 216. In some implementations, the pre-cleaning tool may apply, directly or remotely, hydrogen gas and/or ammonia plasma to the upper surface of the semiconductor device to perform a pre-cleaning operation.

Additionally, or alternatively, one or more semiconductor processing tools (e.g., deposition tool 102 and/or pre-cleaning tool 108) may apply one or more low-k surface (e.g., a material with a small dielectric constant) modifications to the upper surface of the semiconductor device 200. In some implementations, applying the one or more low-k surface modifications to the upper surface of the semiconductor device 200 may include applying one or more surfactants (e.g., an amonsilane) to the upper surface of the semiconductor device 200. In some implementations, the one or more surfactants may react with an upper surface of the substrate 202 to resist and/or prevent deposition of ruthenium on the upper surface of the substrate 202. In some implementations, the one or more surfactants may cause the upper surface of the substrate 202 to become hydrophobic.

Additionally, or alternatively, one or more semiconductor processing tools (e.g., deposition tool 102 and/or pre-cleaning tool 108) may perform a soaking operation to improve ruthenium deposition selectivity (e.g., to facilitate deposition of the ruthenium on materials in the via 204 and to resist deposition of the ruthenium on the substrate 202). In some implementations, the one or more semiconductor processing tools may apply methanol and/or a hydrogen soak to the upper surface of the semiconductor device 200 (e.g., on upper surfaces of the substrate 202 and/or materials in the via 204) to improve the ruthenium deposition selectivity.

In some implementations, a deposition tool (e.g., deposition tool 102) may deposit ruthenium material to form the ruthenium cap 216 on an upper surface of materials within the via 204 of the semiconductor device 200. In some implementations, the deposition tool may use high density plasma deposition, plasma-enhanced chemical vapor deposition, chemical vapor deposition, or physical vapor deposition, among other examples, to deposit the ruthenium material on the materials within the via 204 (e.g., the copper plug 214 and/or or one or more liners).

In some implementations, the one or more semiconductor processing tools may repeat one or more of the multiple operations, including application of one or more low-k surface modifications, a soaking operation, and/or deposition of ruthenium material. In other words, the one or more semiconductor processing tools may iteratively perform the multiple operations to form the ruthenium cap 216 on the upper surface of the materials within the via 204. In some implementations, the ruthenium cap 216 may have a thickness of approximately 0.5 to 3 nanometers.

In some implementations, the one or more semiconductor processing tools may optionally deposit the ruthenium cap 216 (e.g., the ruthenium cap 216 may be included or excluded from the semiconductor device 200). For example, the one or more semiconductor processing tools may deposit the ruthenium cap 216 based on the semiconductor device 200 including the ruthenium-based liner 208 and not including the cobalt-based liner 210 (e.g., or a combined ruthenium-based liner 208 that includes cobalt material). In some implementations, the ruthenium cap 216 may prevent leaking and/or electromigration of material of a cobalt cap (e.g., cobalt cap 218 of FIG. 2H) into the cobalt-based liner 210.

Figure 2H:
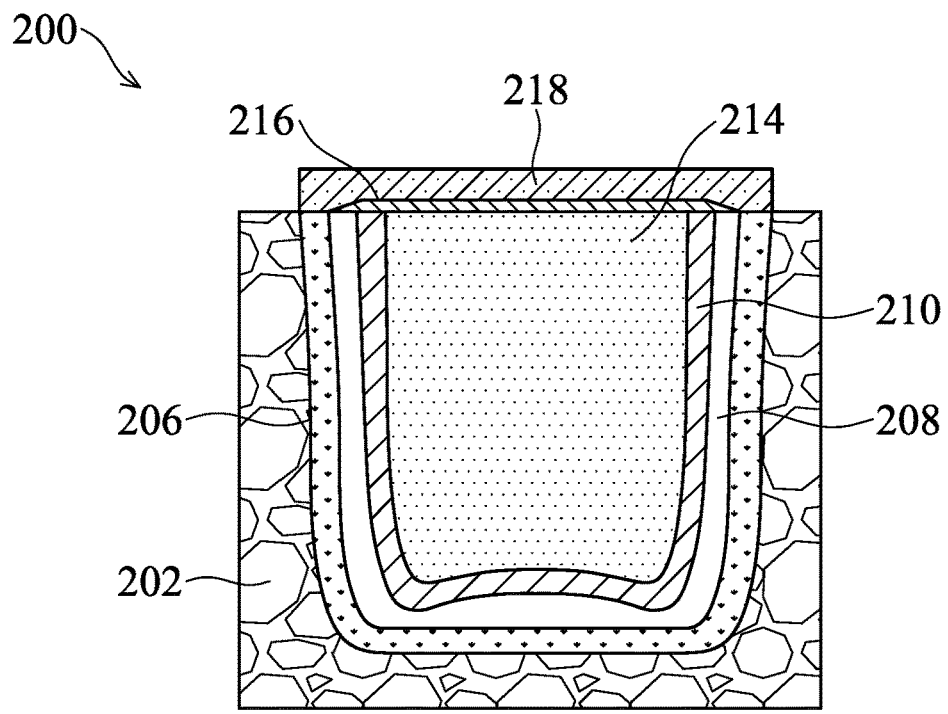

As shown by FIG. 2H, one or more semiconductor processing tools may deposit a cobalt cap 218 on the material within the via 204 and/or on the ruthenium cap 216. In some implementations, the cobalt cap 218 may be disposed on the ruthenium cap 216, if included in the semiconductor device 200, or on material within the via 204 of the semiconductor device 200 (e.g., the copper plug 214 and/or or one or more liners). In some implementations, the cobalt cap may have a thickness of approximately 1 to 5 nanometers. In some implementations, a deposition tool (e.g., deposition tool 102) may deposit the cobalt cap 218 on the ruthenium cap 216 and/or on material within the via 204 of the semiconductor device 200. In some implementations, the deposition tool may use high density plasma deposition, plasma-enhanced chemical vapor deposition, chemical vapor deposition, or physical vapor deposition, among other examples, to deposit the cobalt cap 218 on the ruthenium cap 216 and/or on material within the via 204 of the semiconductor device 200. In some implementations, the cobalt cap may reduce electromigration between the copper plug 214 and one or more materials that may be formed on the copper interconnect.

In some implementations, the ruthenium cap 216 and the cobalt cap 218 may intermix to form a combined cap that includes ruthenium material and cobalt material. In some implementations, the combined cap may include some ruthenium material on a lower surface of the combined cap and some cobalt material on the lower surface of the combined cap.

The number and arrangement of structures and/or layers, among other examples, shown in FIGS. 2A-2H are provided as an example. In practice, a semiconductor device including additional structures and/or layers, fewer structures and/or layers, different structures and/or layers, or differently arranged structures and/or layers than those shown in FIGS. 2A-2H may be processed according to the techniques described above in connection with FIGS. 2A-2H.

FIGS. 3A-3F are diagrams of a examples semiconductor devices 200A-200F formed based on the example techniques described in connection with FIGS. 2A-2H.

Figure 3A:
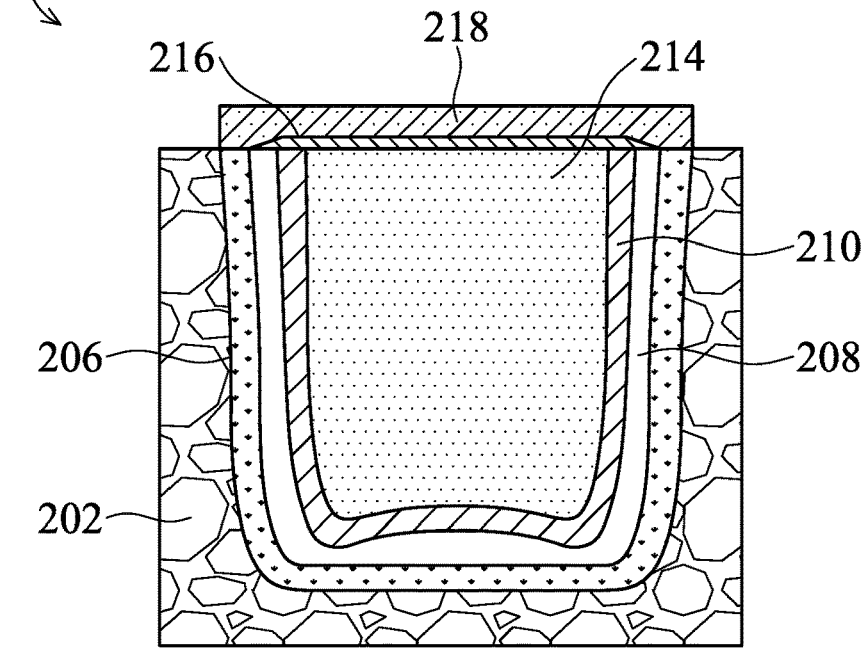
FIGS. 3A-3F are diagrams of example semiconductor devices formed based on the example techniques described in connection with FIGS. 2A-2H.

As shown in FIG. 3A, the semiconductor device 200A includes a substrate 202 that includes a via, a tantalum nitride-based liner 206 deposited within the via on the substrate 202, a ruthenium-based liner 208 within the via on the tantalum nitride-based liner 206, and a cobalt-based liner 210 on the ruthenium-based liner 208. The semiconductor device 200A also includes a copper plug 214 within the via and on the cobalt-based liner 210. As described above, the cobalt-based liner 210 and the ruthenium-based liner 208 may intermix so that the copper plug 214 is in contact with ruthenium material of the ruthenium-based liner 208 and cobalt material of the cobalt-based liner 210. The semiconductor device 200A further includes a ruthenium cap 216 disposed on the copper plug 214 and/or one or more other materials within the via and a cobalt cap 218 disposed on the ruthenium cap 216.

Figure 3B:
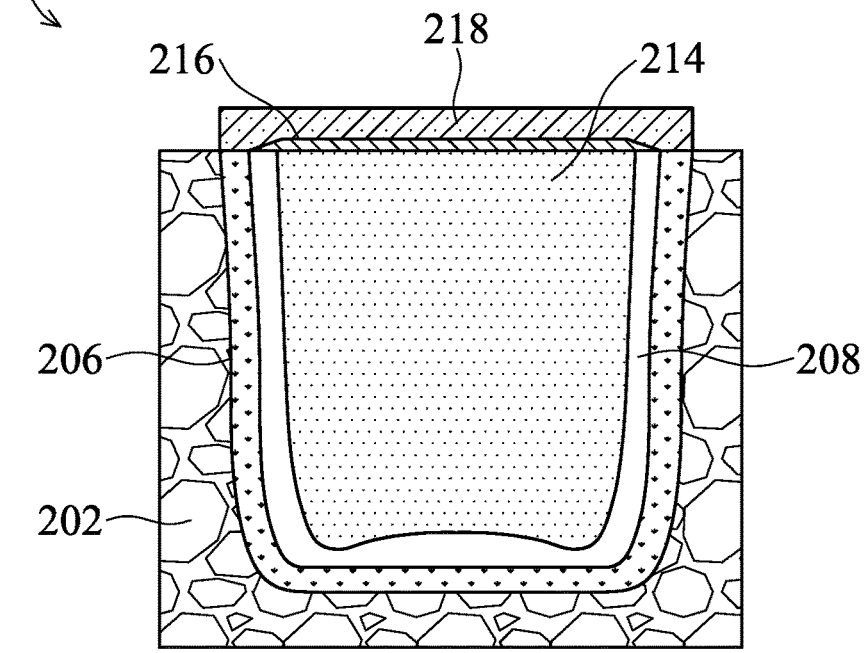

As shown in FIG. 3B, the semiconductor device 200B includes a substrate 202 that includes a via, a tantalum nitride-based liner 206 deposited within the via on the substrate 202, and a ruthenium-based liner 208 within the via on the tantalum nitride-based liner 206. The semiconductor device 200B also includes a copper plug 214 within the via and on the ruthenium-based liner 208. In this example, semiconductor device 200B includes no cobalt-based liner 210 (e.g., the ruthenium-based liner 208 does not include cobalt-based material). The semiconductor device 200B further includes a ruthenium cap 216 disposed on the copper plug 214 and/or one or more other materials within the via and a cobalt cap 218 disposed on the ruthenium cap 216.

Figure 3C:
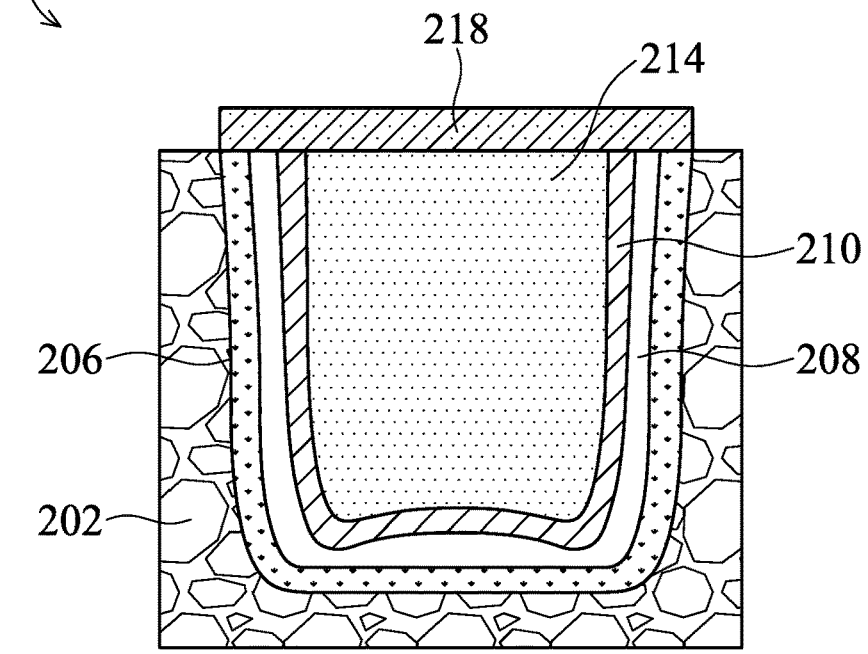

As shown in FIG. 3C, the semiconductor device 200C includes a substrate 202 that includes a via, a tantalum nitride-based liner 206 deposited within the via on the substrate 202, a ruthenium-based liner 208 within the via on the tantalum nitride-based liner 206, and a cobalt-based liner 210 on the ruthenium-based liner 208. The semiconductor device 200C also includes a copper plug 214 within the via and on the cobalt-based liner 210. As described above, the cobalt-based liner 210 and the ruthenium-based liner 208 may intermix so that the copper plug 214 is in contact with ruthenium material of the ruthenium-based liner 208 and cobalt material of the cobalt-based liner 210. The semiconductor device 200C further includes a cobalt cap 218 disposed on the copper plug 214 and/or one or more other materials within the via.

Figure 3D:
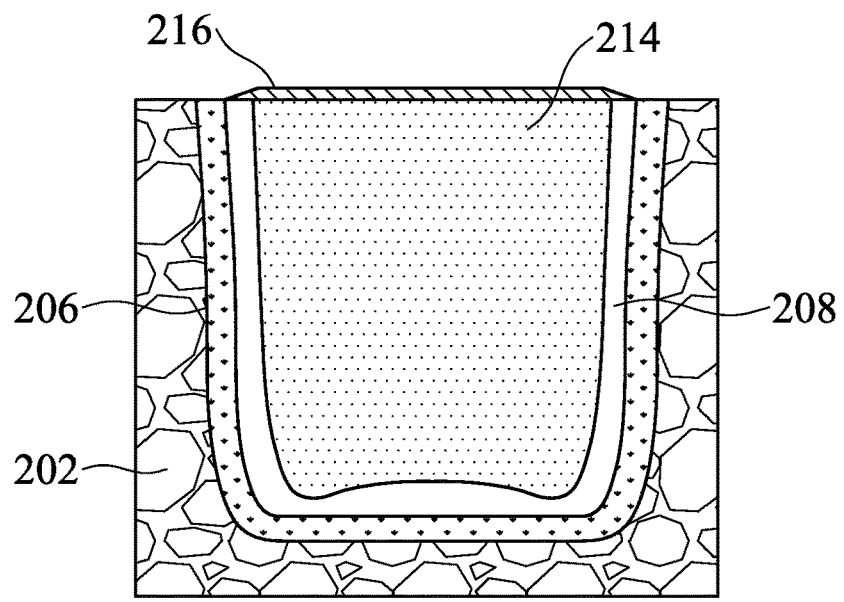

As shown in FIG. 3D, the semiconductor device 200D includes a substrate 202 that includes a via, a tantalum nitride-based liner 206 deposited within the via on the substrate 202, a ruthenium-based liner 208 within the via on the tantalum nitride-based liner 206, and no cobalt-based liner 210 on the ruthenium-based liner 208. The semiconductor device 200D also includes a copper plug 214 within the via and on the ruthenium-based liner 208. In some implementations, the ruthenium-based liner 208 may be a combined ruthenium-based liner that includes cobalt material. The semiconductor device 200D further includes a ruthenium cap 216 disposed on the copper plug 214 and/or one or more other materials within the via.

Figure 3E:
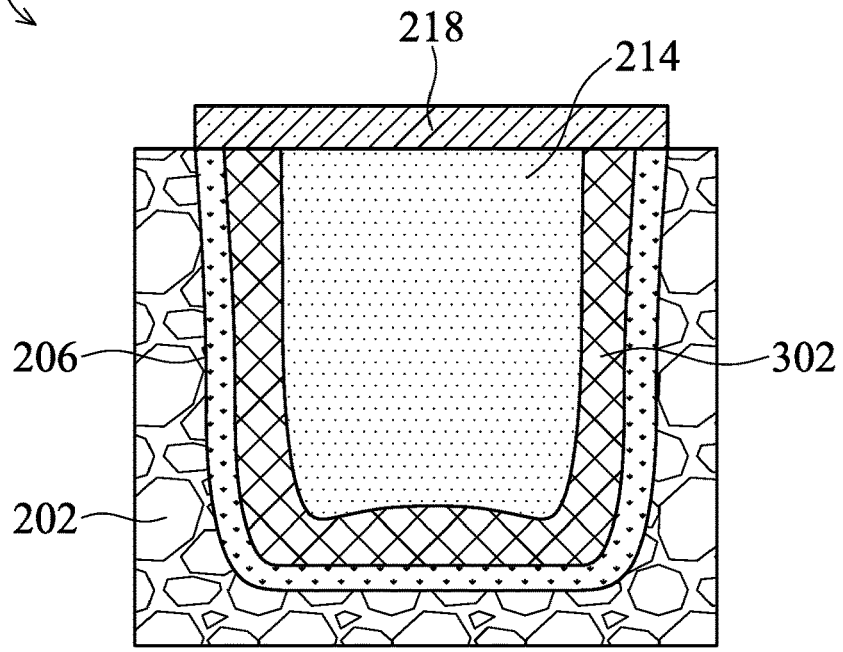

As shown in FIG. 3E, the semiconductor device 200E includes a substrate 202 that includes a via, a tantalum nitride-based liner 206 deposited within the via on the substrate 202, a combined liner 302 (e.g., including ruthenium-based material and cobalt-based material) on the tantalum nitride-based liner 206. The semiconductor device 200E also includes a copper plug 214 within the via and on the cobalt-based liner 210. As described above, the combined liner 302 may be formed from the cobalt-based liner 210 and the ruthenium-based liner 208 intermixing. The semiconductor device 200E further includes a cobalt cap 218 disposed on the copper plug 214 and/or one or more other materials within the via (e.g., the combined liner 302).

Figure 3F:
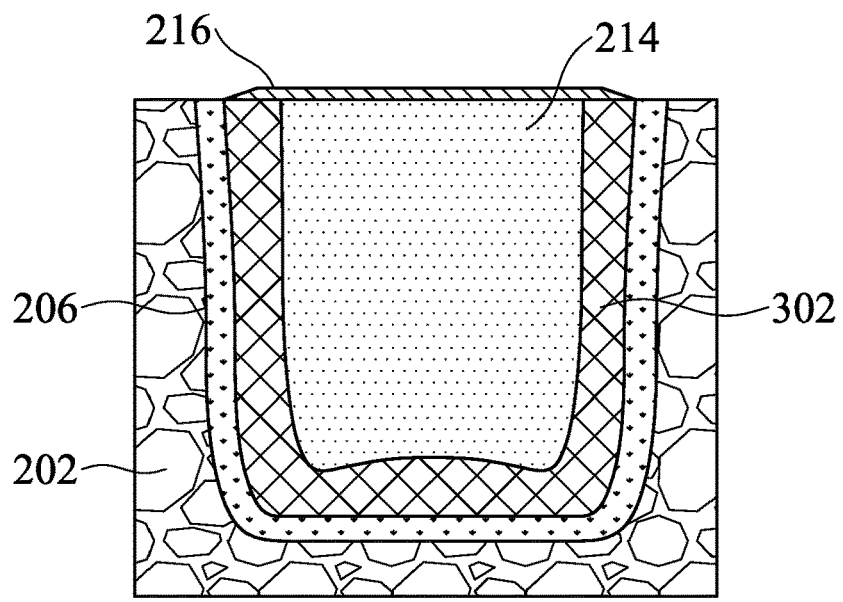

As shown in FIG. 3F, the semiconductor device 200F includes a substrate 202 that includes a via, a tantalum nitride-based liner 206 deposited within the via on the substrate 202, a combined liner 302 (e.g., including ruthenium-based material and cobalt-based material) on the tantalum nitride-based liner 206. The semiconductor device 200F also includes a copper plug 214 within the via and on the cobalt-based liner 210. As described above, the combined liner 302 may be formed from the cobalt-based liner 210 and the ruthenium-based liner 208 intermixing. The semiconductor device 200F further includes a ruthenium cap 216 disposed on the copper plug 214 and/or one or more other materials within the via (e.g., the combined liner 302).

As indicated above, FIGS. 3A-3F are provided as examples. Other examples may differ from what is described with regard to FIGS. 3A-3F.

Figure 4:
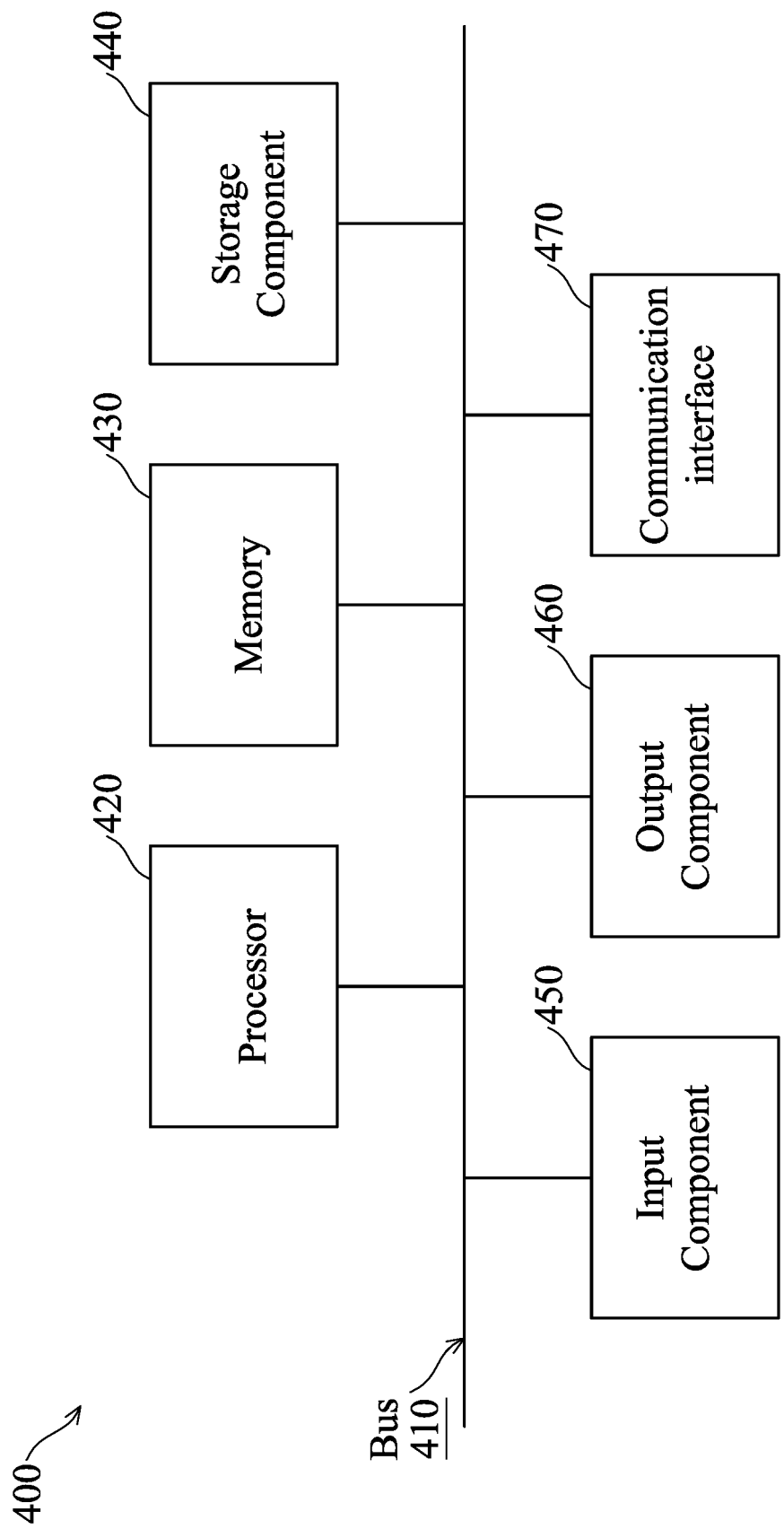
FIG. 4 is a diagram of example components of one or more devices of FIG. 1.

FIG. 4 is a diagram of example components of a device 400. In some implementations, deposition tool 102, etching tool 104, CMP tool 106, pre-cleaning tool 108 and/or wafer/die transport device 110 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, and/or an actuator, among other examples. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, and/or an antenna, among other examples.

Device 400 may perform one or more processes described herein. For example, a non-transitory computer-readable medium (e.g., memory 430 and/or storage component 440) may store a set of instructions (e.g., one or more instructions, code, software code, and/or program code, among other examples) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
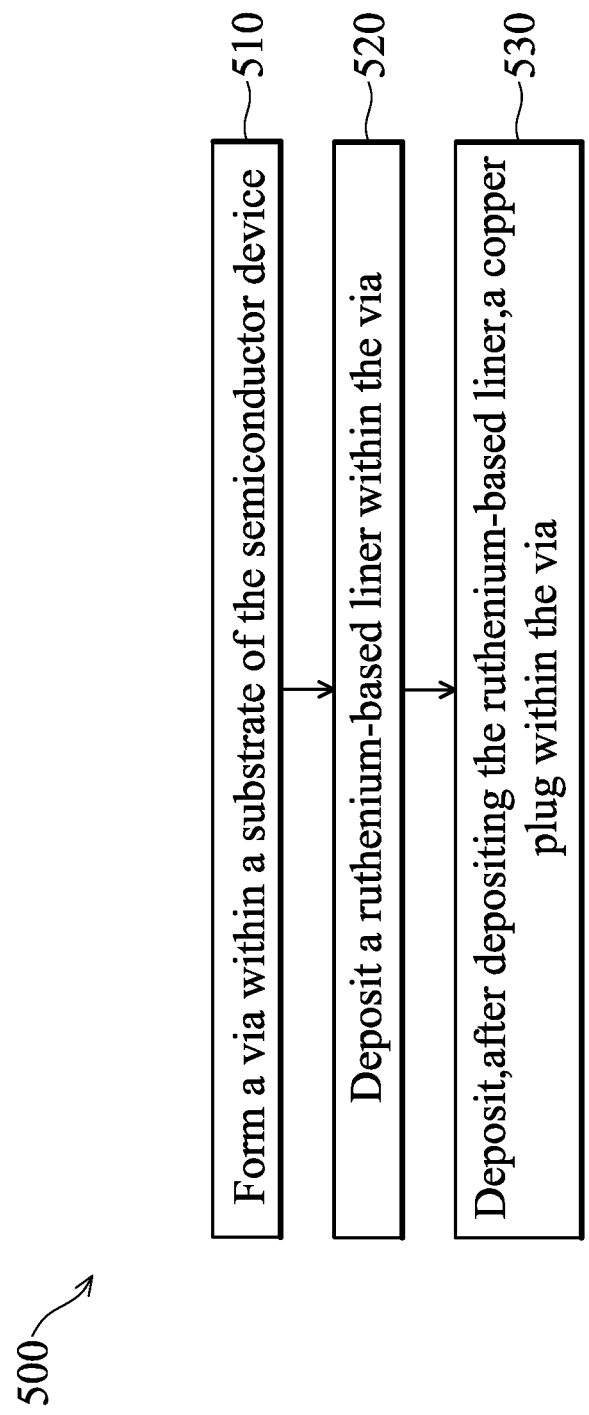
FIG. 5 is a flowchart of an example process of manufacturing a semiconductor device, as described herein.

FIG. 5 is a flowchart of an example process of manufacturing a semiconductor device. In some implementations, one or more process blocks of FIG. 5 may be performed by one or more semiconductor processing tools (e.g., one or more of deposition tool 102, etching tool 104, CMP tool 106, pre-cleaning tool 108, and/or wafer/die transport device 110). Additionally, or alternatively, one or more process blocks of FIG. 5 may be performed by one or more components of device 400, such as processor 420, memory 430, storage component 440, input component 450, output component 460, and/or communication component 470.

As shown in FIG. 5, process 500 may include forming a via within a substrate of the semiconductor device (block 510). For example, the one or more semiconductor processing tools may form a via 204 within a substrate 202 of the semiconductor device 200, as described above.

As further shown in FIG. 5, process 500 may include depositing a ruthenium-based liner within the via (block 520). For example, the one or more semiconductor processing tools may deposit a ruthenium-based liner 208 within the via 204, as described above.

As further shown in FIG. 5, process 500 may include depositing, after depositing the ruthenium-based liner, a copper plug within the via (block 530). For example, the one or more semiconductor processing tools may deposit, after depositing the ruthenium-based liner 208, a copper plug 214 within the via 204, as described above.

Process 500 may include additional implementations, such as any single implementation or any combination of implementations described below and/or in connection with one or more other processes described elsewhere herein.

In a first implementation, process 500 includes depositing, before depositing the ruthenium-based liner 208 within the via 204, a tantalum nitride-based liner 206 within the via 204, wherein depositing the ruthenium-based liner 208 within the via 204 comprises depositing the ruthenium-based liner 208 on the tantalum nitride-based liner 206.

In a second implementation, alone or in combination with the first implementation, process 500 includes depositing, before depositing the copper plug 214 within the via 204, a cobalt-based liner 210 within the via 204, wherein depositing the copper plug 214 within the via 204 comprises depositing the copper plug 214 on the cobalt-based liner 210.

In a third implementation, alone or in combination with one or more of the first and second implementations, depositing the copper plug 214 within the via 204 comprises depositing copper material 212 within the via 204 and on an upper surface of the semiconductor device 200, and performing, after depositing the copper material 212, a chemical-mechanical polishing process to remove the copper material 212 from the upper surface of the semiconductor device 200.

In a fourth implementation, alone or in combination with one or more of the first through third implementations, process 500 includes depositing, after depositing the copper plug 214, a ruthenium cap 216 on an upper surface of the via 204.

In a fifth implementation, alone or in combination with one or more of the first through fourth implementations, process 500 includes performing, before depositing the ruthenium cap 216 and after performing a chemical-mechanical polishing process on an upper surface of the copper plug 214, a pre-cleaning operation on an upper surface of the semiconductor device 200.

In a sixth implementation, alone or in combination with one or more of the first through fifth implementations, performing the pre-cleaning operation comprises application of one or more of hydrogen or ammonia plasma.

In a seventh implementation, alone or in combination with one or more of the first through sixth implementations, process 500 includes applying, before depositing the ruthenium cap 216, a surfactant material to an upper surface of the substrate 202, wherein the surfactant material is configured to react with the substrate 202 to resist deposition of ruthenium material on the upper surface of the substrate 202.

In an eighth implementation, alone or in combination with one or more of the first through seventh implementations, process 500 includes applying, before depositing the ruthenium cap 216, one or more of methanol or a hydrogen soak to an upper surface of the substrate 202, wherein the one or more of the methanol or the hydrogen soak are configured to react with the substrate 202 to resist deposition of ruthenium material on the upper surface of the substrate 202.

In a ninth implementation, alone or in combination with one or more of the first through eighth implementations, process 500 includes depositing a cobalt cap 218 on an upper surface of the ruthenium cap 216.

In a tenth implementation, alone or in combination with one or more of the first through ninth implementations, depositing the copper plug 214 comprises depositing the copper plug 214 using a reflow deposition operation.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Based on using a ruthenium-based liner within the via, copper material may penetrate the via during a deposition process, even when using a narrow via (e.g., less than about 12 nanometers). In some implementations, the ruthenium-based liner may reduce protrusion into a top portion of the via and/or may reduce a pinch point at the top portion of the via. This may facilitate deposition of the copper plug within the via, which may improve uniformity of copper material within the via, reduce voids within the via, and improve performance of the copper plug as a copper interconnect within the semiconductor device.

As described in greater detail above, some implementations described herein provide a method of manufacturing a semiconductor device. The method includes forming a via within a substrate of the semiconductor device. The method includes depositing a ruthenium-based liner within the via. The method includes depositing, after depositing the ruthenium-based liner, a copper plug within the via.

As described in greater detail above, some implementations described herein provide a semiconductor device. The semiconductor device includes a via within a substrate. The semiconductor device includes a ruthenium-based liner disposed within the via. The semiconductor device includes a copper plug disposed on the ruthenium-based liner within the via.

As described in greater detail above, some implementations described herein provide a semiconductor device. The semiconductor device includes a via within a substrate. The semiconductor device includes a liner, including ruthenium material and cobalt material, disposed within the via. The semiconductor device includes a copper plug disposed on at least a portion of the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a via within a substrate of the semiconductor device;
    depositing a first liner comprising a first material within the via;
    depositing a second liner comprising a second material on the first liner within the via;
    depositing, after depositing the second liner, a plug comprising a third material within the via;
    depositing a first cap comprising the second material directly on an upper surface of the plug and an upper surface of the second liner; and
    depositing a second cap comprising a metal material directly on an upper surface of the first cap and on an upper surface of the first liner,
    wherein the second cap is deposited to be laterally within the via.

2. The method of claim 1, wherein the first liner is a tantalum nitride-based liner, the second liner is a ruthenium-based liner, and the plug is a copper plug.

3. The method of claim 1, further comprising:
    depositing, before depositing the plug within the via, a third liner comprising the metal material within the via,
    wherein depositing the plug within the via comprises depositing the plug on the third liner.

4. The method of claim 3, wherein depositing the first cap comprises:
    depositing the first cap on an upper surface of the third liner.

5. The method of claim 3, wherein the plug is a copper plug and the third liner is a cobalt-based liner.

6. The method of claim 1, wherein depositing the plug within the via comprises:
    depositing the third material within the via and on an upper surface of the semiconductor device, and
    performing, after depositing the third material, a chemical-mechanical polishing process to remove the third material from the upper surface of the semiconductor device.

7. The method of claim 1, further comprising:
    performing, before depositing the first cap and after performing a chemical-mechanical polishing process on the upper surface of the plug, a pre-cleaning operation on an upper surface of the semiconductor device.

8. The method of claim 7, wherein performing the pre-cleaning operation comprises application of one or more of hydrogen or ammonia plasma.

9. The method of claim 1, further comprising:
    applying, before depositing the first cap, a surfactant material to an upper surface of the substrate,
        wherein the surfactant material is configured to react with the substrate to resist deposition of the second material on the upper surface of the substrate.

10. The method of claim 1, further comprising:
    applying, before depositing the first cap, one or more of methanol or a hydrogen soak to an upper surface of the substrate,
        wherein the one or more of the methanol or the hydrogen soak are configured to react with the substrate to resist deposition of the second material on the upper surface of the substrate.

11. The method of claim 1, wherein the second cap a cobalt cap and the first cap is a ruthenium cap.

12. The method of claim 1, wherein depositing the plug comprises:
    depositing the plug using a reflow deposition operation.

13. A semiconductor device, comprising:
    a via within a substrate of the semiconductor device;
    a first liner comprising a first material disposed within the via;
    a second liner comprising a second material disposed on the first liner within the via;
    a plug comprising a third material disposed on the second liner within the via;
    a first cap comprising the second material disposed directly on an upper surface of the plug and an upper surface of the second liner; and
    a second cap comprising a metal material disposed directly on an upper surface of the first cap and on an upper surface of the first liner,
    wherein the second cap is laterally aligned with the via.

14. The semiconductor device of claim 13, wherein the first cap is a ruthenium cap, the second cap is a cobalt cap, and the plug is a copper plug.

15. The semiconductor device of claim 13, wherein the first liner is a tantalum nitride-based liner and the second liner is ruthenium-based liner.

16. The semiconductor device of claim 13, wherein the second liner is a ruthenium-based liner, wherein the second material is ruthenium material and, and wherein the ruthenium-based liner further comprises cobalt material.

17. A semiconductor device, comprising:
    a via within a substrate of the semiconductor device;
    a first liner comprising a first material disposed within the via;
    a second liner, comprising a second material and a third material, on the first liner disposed within the via;
    a plug comprising a fourth material disposed on at least a portion of the second liner;
    a first cap comprising the second material disposed directly on an upper surface of the plug and an upper surface of the second liner; and
    a second cap comprising the third material disposed directly on an upper surface of the first cap and on an upper surface of the first liner,
    wherein the second cap is laterally aligned with the first liner.

18. The semiconductor device of claim 17, wherein the first cap is a ruthenium cap, the second cap is a cobalt cap, and the plug is a copper plug.

19. The semiconductor device of claim 17, wherein the plug is a copper plug, the second material is ruthenium material, and the third material is cobalt material, and wherein the copper plug is in contact with the ruthenium material and the cobalt material.

20. The semiconductor device of claim 17, the first liner is a tantalum nitride-based liner, the second material is ruthenium material, the third material is cobalt material, and the plug is a copper plug.

* * * * *

UNITED STATES PATENT AND TRADEMARK OFFICE
CERTIFICATE OF CORRECTION

| | | |
|---|---|---|
| PATENT NO. | : 12,094,770 B2 | Page 1 of 1 |
| APPLICATION NO. | : 17/446398 | |
| DATED | : September 17, 2024 | |
| INVENTOR(S) | : Yao-Min Liu et al. | |

It is certified that error appears in the above-identified patent and that said Letters Patent is hereby corrected as shown below:

In the Claims

In Claim 11, Column 14, Line 15, "wherein the second cap a" should be changed to -- wherein the second cap is a --.

Signed and Sealed this
Fifteenth Day of October, 2024

Katherine Kelly Vidal
*Director of the United States Patent and Trademark Office*